United States Patent [19]

Krueger

[11] Patent Number: 5,552,579

[45] Date of Patent: Sep. 3, 1996

[54] SYSTEM FOR SALVAGE AND RESTORATION ON ELECTRICAL COMPONENTS FROM A SUBSTRATE

[76] Inventor: Ellison Krueger, 2634 S. Gaucho, Mesa, Ariz. 85202

[21] Appl. No.: 273,223

[22] Filed: Jul. 11, 1994

[51] Int. Cl.⁶ .................................................... F27D 11/02
[52] U.S. Cl. ........................ 219/411; 219/391; 219/395; 219/386; 29/403.4
[58] Field of Search ............................... 219/385, 386, 219/390, 391, 399, 400, 409, 411, 388; 228/119, 33, 180.1, 232, 20.1, 42; 29/403.4, 426.5

[56] References Cited

U.S. PATENT DOCUMENTS

| | | | |
|---|---|---|---|
| 3,414,709 | 12/1968 | Tricault | 219/411 |
| 3,557,430 | 1/1971 | Jones | 228/19 |
| 3,626,155 | 12/1971 | Joeckel | 219/411 |
| 3,684,151 | 8/1972 | Burman et al. | 228/19 |
| 3,878,936 | 4/1975 | Niggemyer | 198/860.2 |
| 4,270,260 | 6/1981 | Krueger | 29/403.4 |
| 4,345,143 | 8/1982 | Craig et al. | 219/411 |
| 4,876,437 | 10/1989 | Kondo | 219/388 |
| 5,155,336 | 10/1992 | Gronet et al. | 219/411 |
| 5,163,599 | 11/1992 | Mishina et al. | 228/42 |
| 5,259,546 | 11/1993 | Volk | 228/102 |

Primary Examiner—Tu Hoang
Attorney, Agent, or Firm—Gregory J. Nelson

[57] ABSTRACT

A salvage system for on-site removal and recovery of electrical components such as IC's from PC boards. The unit may be mobile having at least two heating stations, each of which includes a mounting apparatus which positions the PCB above an array of infrared heating sources. Initial heating occurs at the first station and subsequent heating to above the eutectic point of the solder occurs at the second station. The unit is designed so that a minimum of workers can attend to the initial sorting, cleaning, sequential heating, extracting and storing of removed components. The heating apparatus includes a fan, baffle and deflector arrangement which helps to maintain even heating and avoidance of hot spots.

15 Claims, 2 Drawing Sheets

COUNT CLASSIFY AND SORT

PREHEAT TO 1ST TEMP. (1ST TABLE)

HEAT TO 2ND TEMP. (2ND TABLE)

SORT

CLEAN & REPAIR

SYSTEM FOR SALVAGE AND RESTORATION ON ELECTRICAL COMPONENTS FROM A SUBSTRATE

FIELD OF THE INVENTION

The present invention relates to a system for salvaging electronic components and more particularly relates to a particularly efficient apparatus and process for de-soldering components such as integrated circuits from printed circuit boards which may be mobile.

DESCRIPTION OF PRIOR ART

Solid state electronic circuits containing components fabricated as individual units are termed integrated circuits (IC's). An integrated circuit generally includes a body hang leads connected to the contained solid state elements. Integrated circuit packages are usually mounted on a printed circuit board (PCB). The printed circuit board or substrate provides the interconnecting circuit been circuit components such as resistors, capacitors, diodes, transistors and the like with the integrated circuits. The leads of the integrated circuits are mounted by fitting the leads into holes formed within the printed substrate (thru-hole) or adhering parallel conductive surfaces (surface mount).

The most usual method of fabrication of circuit patterns is to use both sides of the circuit board for ring. Printed circuits are usually made of copper foil cemented on epoxy-glass boards. The process in use today for thru-hole attachment employs a deuce for parting a wave-like motion to a solder bath to effectuate the connection and cause the conductive leads to become mechanically and electrically integral with the circuit. Various other types of system packaging are also used. Hot vapor, infrared and wave solder are commonly used processes for surface mount attachment. Semiconductor chips may be connected by vacuum deposited metal conductors. Thin film technology is also used for this purpose.

Another approach is the thick film circuitry in which conductor strips and resistors are deposited by printing using screening masks and inks which consist of colloidal metals and metal oxides mixed with organic binders. After printing, the substrate is fired at an appropriate temperature and the circuit is encapsulated.

It often becomes necessary or desirable to remove the IC's and other components from the substrate either for repair or for salvage and subsequent recycling and re-use. The problems in removal of such components are substantial. Conventionally, when it is necessary to remove a component such as an IC resistor, diode or transistor from the substrate, the leads are heated causing the solder to re-flow and the component is mechanically pried loose from the board. Alternatively, components can be cut from the board. These techniques are expensive, time consuming and wasteful and may result in damage to the component.

Further, in the case of IC's, it is difficult to heat the leads to the integrated circuit by conventional means without damaging the IC's. Thus, it has not always been generally economically feasible to recover and salvage functional IC's from PCB's.

Several suggestions can be found in the prior art relative to apparatus and methods for removal of components and IC's in a manner to permit recovery and restoration of the components. U.S. Pat. No. 3,557,430 shows an apparatus for removing a component from a substrate to which it has been soldered utilizing a concentrated source of heat encompassing the solder connections. The substrate is located approximate the heat source and a tension device is secured to the component and removes the component when solder connections are exposed to the heat source.

A somewhat similar approach is shown in U.S. Pat. No. 3,684,151 which discloses a soldering machine for removing IC's from a printed circuit board. The apparatus includes a closed bath of molten solder which has a passage leading from the bath. The printed circuit board is secured in a positioning frame at the open end of the passage and guided by a template so that the circuit element is positioned with the soldered leads over the opening. When in this position, a plunger displaces a portion of the solder and the molten solder level in the passage rises to contact the leads to permit removal of the leads.

While both of the foregoing techniques are effective, they are inconvenient in that they utilize a molten solder bath. Further, the techniques require a positioning apparatus to isolate a portion of the printed circuit board and therefore are not adaptable to efficient high rate removal and restoration of components. Use of a molten solder bath as practiced in these patents can result in damage to components.

U.S. Pat. No. 3,878,936 shows a more recent development in which the printed circuit board is held in air-tight contact in a vessel. A vacuum source is applied to the vessel and a point source of heat is applied to each lead. When the solder is melted, a vacuum valve is opened and air rushes outwardly to drive the leads out of the holes. This technique requires point source application of heat by soldering gun, alcohol torch or other apparatus which may be insufficient to free the leads.

One particular method for salvage and restoration of integrated circuits from a substrate is shown in the present applicant's prior patent, U.S. Pat. No. 4,270,260. This patent, which covers a method which has achieved considerable commercial success, relates to a unique and efficient process for removal of IC's with minimal damage. An infrared heat source and a mounting frame for securing the boards in the position to absorb the infrared energy and affect heating is utilized. Energy absorbed by the darker, nonreflective PCB board material and conducted to the reflective solder joints, causes even general temperature rise. Temperature control is maintained by inducing a regulated flow of air across the PCB. When the solder joints reach melting temperature, an extraction tool is used to remove IC's.

The present invention represents an improvement over the '260 patent in that the present invention provides a highly efficient salvage system which may be mobile. The mobility of the apparatus of the present invention permits the salvage operation to be carried out at any location, as for example, directly at a collection location providing efficiency and economy in the salvage operation. Further, the mobile device of the present invention is designed to provide sequential desoldering operations and maximize the utilization of the workers employed in carrying out the operation. Also, desoldering now extends beyond thru-hole packaged IC's to include surface mount packaged IC's.

SUMMARY OF THE INVENTION

Briefly, in accordance with the system of the present invention, a mobile salvage unit is provided having an initial intake area, at least first and second heating stations, storage and classifying areas, and necessary on-board support equipment such as portable generator, and electrical distribution panels. The mobile unit may be a towable trailer or a truck trailer or a self-propelled van unit. An area of the unit is designated the "intake" and is the area where a worker receives the PCB's to be processed for initial sorting and counting. At least two processing stations are provided, the first for pre-heating and subsequent desoldering. Each station includes an infrared heat source and a mounting frame for securing the mounting boards in a position to absorb the infrared energy to affect heating. Energy is absorbed by the darker, nonreflective PCB board materials and conducted to the shiny, reflective soldered joints to achieve a uniform temperature rise. Temperature control is maintained by inducing a regulated air flow across the infrared heat source.

The PCB's are initially processed by pre-heating to a first predetermined temperature at the first processing station and then transferred to the second processing station where further heating occurs to de-solder the components. Heating at the first station generally elevates the solder to a temperature of between 350° to 400° and subsequent heating at the second de-soldering station elevates the solder to above the eutectic temperature. The stations are arranged so that a single person can operate both processing stations performing the necessary steps of loading, transferring and unloading the boards and removing the de-soldered components at the second station. The arrangement of the unit allows a second worker to attend to the initial processing of the incoming PCB's including counting and sorting and thereafter classifying removed components subsequent to the removal at the de-soldering station. The extracted components can then be subjected to any necessary treatments such as cleaning, tinning and straightening of leads.

BRIEF DESCRIPTION OF THE DRAWINGS

The present invention will be more fully understood from the following description, claims and drawings in which:

DESCRIPTION OF THE PREFERRED EMBODIMENT(S)

Figure 1:
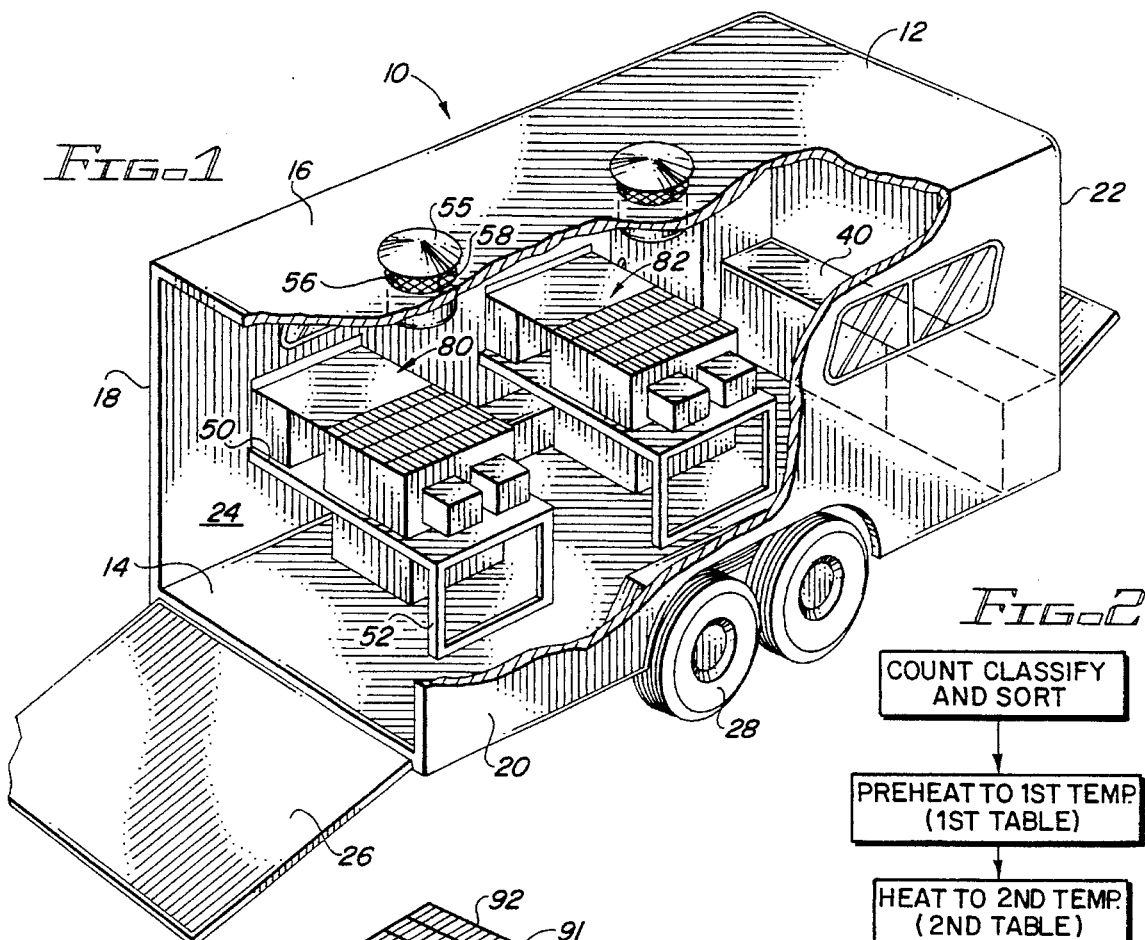
FIG. 1 is a perspective view partly broken away illustrating the mobile desoldering unit of the present invention.
Figure 2:
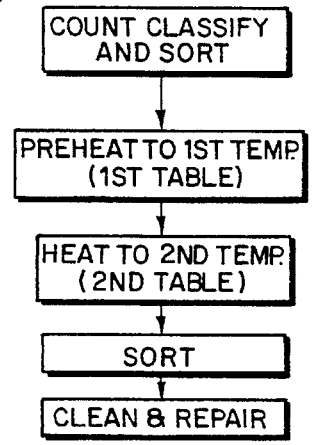
FIG. 2 is a process flow chart indicating the basic steps involved in processing PCB's according to the present invention.

Turning to the drawings, the mobile salvage apparatus of the present invention is generally designated by the numeral 10 and is shown as a mobile trailer unit 12 having a floor 14, roof 16, opposite side walls 18 and 20, rear wall 22. The front of the trailer 12 provides an entrance 24 which is accessible by means of lowering door 26 which also serves as an access ramp as shown in FIG. 1. The trailer 12 is supported on an axle and wheel assembly 28 in conventional manner so that the trailer may be towed by a towing vehicle. Alternatively, the trailer may be self-propelled and the trailer components incorporated in a van-like vehicle or a bus. For purposes of description, the mobile unit will be described as a trailer, it being understood that the unit may be incorporated in other types of vehicles.

Figure 6:
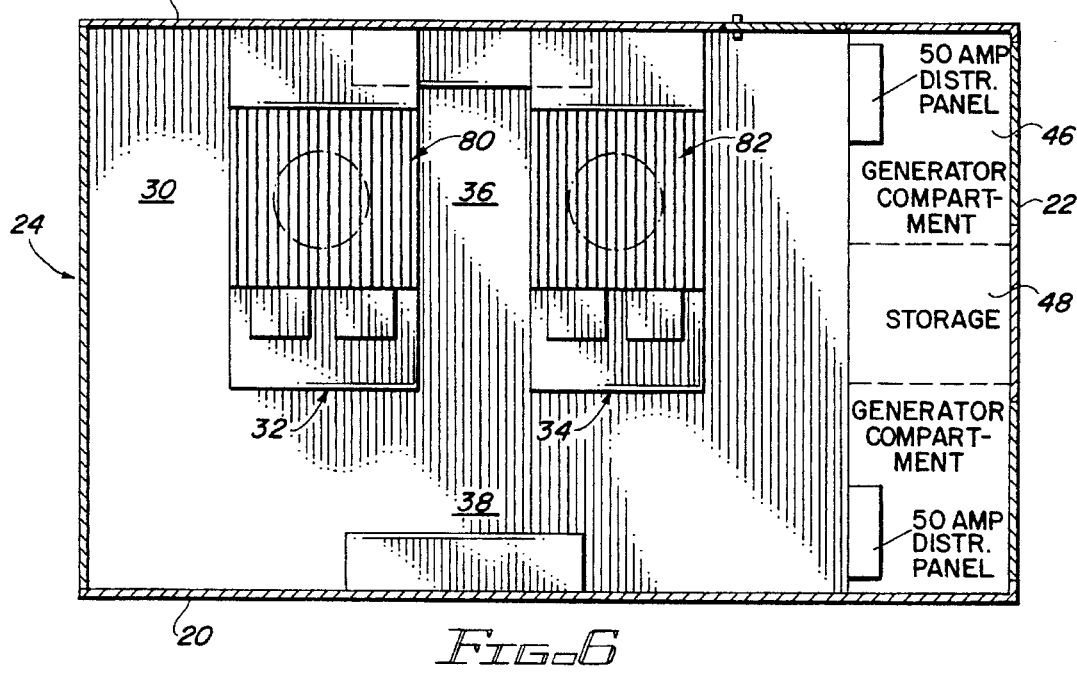
FIG. 6 is a plan view of the mobile processing unit.

As best seen in FIG. 6, the mobile unit is generally rectangular having incoming or work-receiving area 30 adjacent the entrance 24. A first heating station 32 is positioned rearward of the incoming area 30 with a de-soldering station 34 positioned rearward of the first station. A work space 36 is provided between the stations where a worker is positioned. An aisle 38 extends longitudinally along the side wall 20 of the unit. The rear of the unit is provided with a transversely extending work table 40 which provides a surface for sorting, classifying and refurbishing removed components. The area beneath the work table provides a storage area 48 and houses suitable electrical equipment such as generators and electrical distribution equipment at area 46. The electrical equipment is not shown in detail as it is conventional. For most applications, a pair of generators, consisting of a primary and a back-up generator of the necessary capacity is required for a unit as shown.

Each of the heating stations includes a table 50 which extends horizontally from wall 18 leaving aisle 38 adjacent wall 20. Each table is supported on legs 52 at a convenient height. An exhaust unit 55 is located above each of the work stations in the roof 16 of the unit. Each of the exhaust units 55 includes a housing 56 which receives an exhaust fan which is not shown as such fans are convention. The fan unit has an external discharge 58 so that fumes drawn from the interior of the unit are discharged to the outside as is well known. A suitable filter such as a charcoal filter for removal of particulates and certain gases to meet the most stringent EPA requirements must also be incorporated into the exhaust fan unit.

Figure 3:
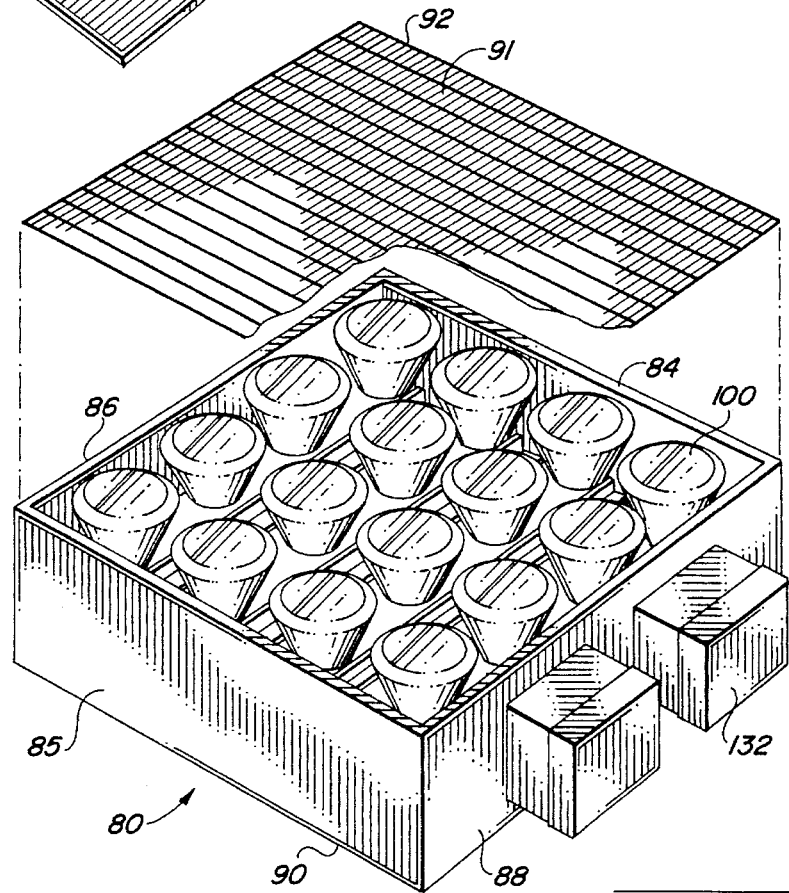
FIG. 3 is a perspective exploded view of the heating apparatus utilized at the two de-soldering work stations.

Heating devices 80 and 82 are positioned at the stations 32 and 34. The desoldering devices 80 and 82 are similar and therefore a description of one of the devices will apply to both. FIG. 3 illustrates the heating apparatus 80 which is shown as being generally rectangular having side walls 84 and 85, inner end wall 86, outer end wall 88, interconnected by a horizontal floor 90 forming a box-like housing having an open top. A work supporting surface 91 rests on the upper edges of the housing. The work supporting surface 91 is comprised of a series of intersecting extending grid elements 92 of suitable heat resistant material such as stainless steel.

An array of heat sources 100 are positioned within the housing, preferably arranged in parallel rows, as shown. The heat sources are infrared heat lamps such as 250 watt lamps which are practical for this application because of their commercial availability. The lamps are preferably positioned in the housing with a clearance of 1 ½"2 ½" between the bulbs and between the bulbs and the sides of the housing. Similarly, the bulbs are positioned so that a clearance "A" of approximately 1 ½" to 2 ½" exists between the upper-most point of the bulb and the work-supporting surface 91. The individual bulbs are engaged in vertically positioned sockets 102 which are suitably connected to a source of electrical power such as the on-board generator.

A baffle plate 110 extends horizontally within the confines of the housing at an elevation approximately corresponding to the top edge of the electrical sockets 102. The baffle 110 defines a plurality of apertures aligned with the receptacles 102 to facilitate insertion and removal of the infrared heat sources 100 in the sockets.

Figure 4:
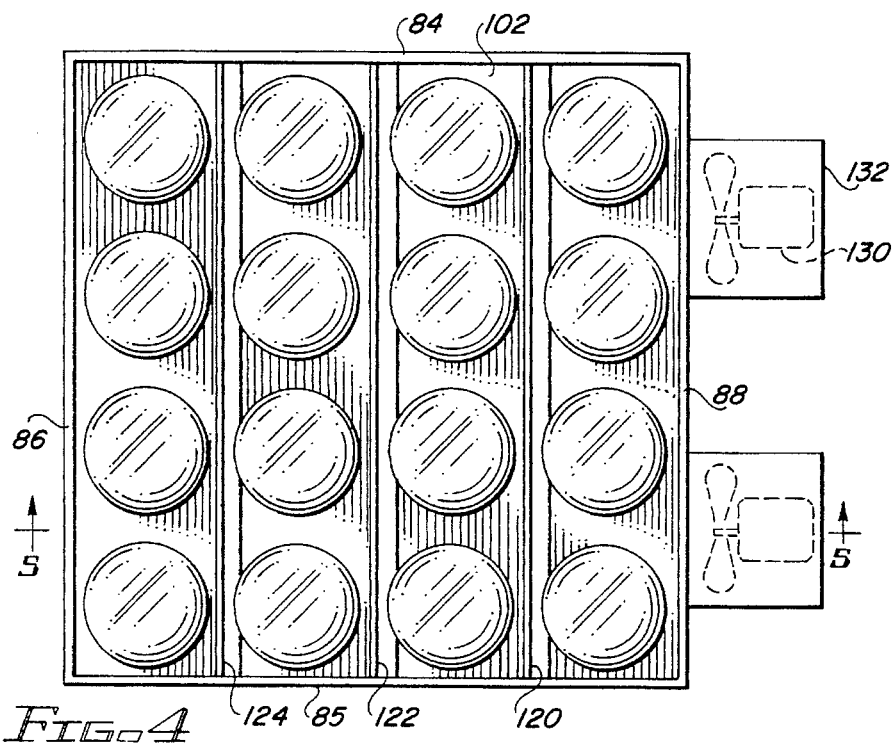
FIG. 4 is a plan view of the heating apparatus with work supporting surface removed.

As best seen in FIG. 4, a plurality of deflectors 120, 122 and 124 extend between the side walls 84 and 85 of the housing being mounted on the upper surface of baffle 102. The deflectors are arranged between adjacent rows of the bulbs. Each of the deflectors is generally L-shaped having vertically upstanding leg. For example, deflector 120 has leg 120A; deflector 122 has leg 122A and deflector 124 has upstanding leg 124A. The upstanding legs are shown as progressively increasing in vertical height with leg 120A being the shortest and leg 124A being the longest. This arrangement allows the air from the fan units 130 to be evenly distributed across the housing interior and deflects the air upwardly which results in even heating and avoidance of hot spots.

Figure 5:
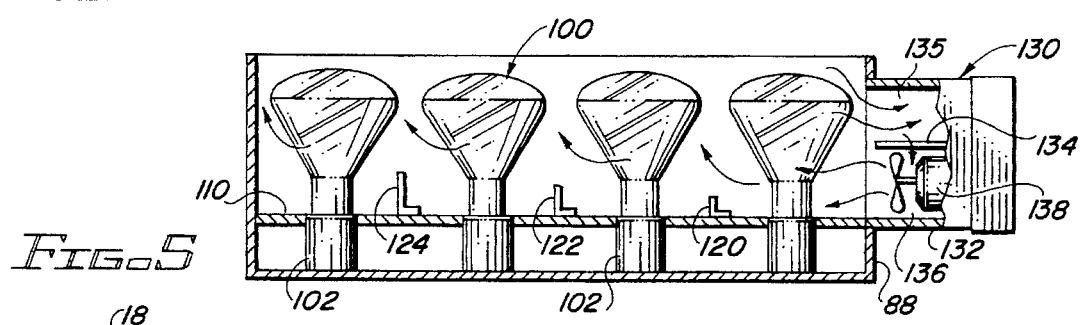
FIG. 5 is a sectional view taken along line 5—5 of FIG. 4.

The fan units 130 are each shown having a housing 132 which is securable to the wall 88 of the housing. The fan housing is divided by a partition 134 into an inlet duct 135 and an exhaust duct 136, both communicating with the interior of the housing. A small electric fan unit 138 is positioned in the exhaust duct. As indicated by the arrows in FIG. 5, air flow is discharged from the fan horizontally to the interior of the housing above the baffle at a level approximately aligned with the deflectors 120, 122, 124. The air flow proceeds horizontally and is progressively deflected upwardly along the outer surface of the heat sources. Return air flows to the inlet duct 135 to be recirculated to the housing. As mentioned above, the air flow pattern is important in providing even distribution of heat and to avoid hot spots.

The advantages and efficiency of the system of the present invention will be fully understood from the following description of operation.

Printed circuit boards are available in various sizes and support various types of components such as resistors, capacitors, diodes and integrated circuits all of which may be removed for salvage and possible re-use. In use, the mobile salvage unit 10 is transported to a suitable location such as a collection site used by a refurbisher of components. Generally only two workers are required for the efficient operation of a two-station unit as shown in FIG. 1. A first worker is positioned in the incoming, processing area 30 and will initially sort, log and count the various PCB's by type. If the boards are excessively contaminated, the boards may require an initial washing in an appropriate solution.

The top side of a double-sided PCB may need pre-treatment with flux to enhance heat transfer during desoldering, specially if SN5 or other high temperature solders have been used to secure the components in place. A typical flux for this purpose would be Kester 197 or an equivalent, moderately active flux.

Once the board has been sorted, cleaned and pre-treated if necessary, the mechanical hardware components such as nuts, bolts, component socket, are removed at the incoming processing area by a first worker. Once these steps are completed, the board is then placed on the work surface 90 at the first or initial heating station 80. A second worker is positioned in the area 36 between the heating stations. Preferably the boards are approximately centered over the array of infrared heat sources on surface 90. The heat sources are positioned so that a predetermined clearance of about 1 ½" to 2 ½" exists between the work supporting surface 90 and the upper-most point of the infrared bulbs which is indicated as dimension A in FIG. 5. The bottom of the surface 91 and a plane tangent to the upper surfaces of the heat sources should be substantially parallel. In the event the board has an obstructing or extremely heavy component, such component should be removed during the incoming preparation stage to prevent excessive warpage which could lead to serious heating differentials.

Once the board is positioned in place on the work surface 90 at the first heating station, the heat sources are energized. The arrangement of the units permits loading of boards at heating station 80 to be conveniently performed by the worker in area 30. Fan exhaust generally will be continually operational, particularly if chemical pretreatment of the boards is necessary. Further, since the unit is open at one end, the ramp 26 provides convenient access to the ramp and also allows the initial sorting and classification to be accomplished at an exterior location adjacent the van to minimize exposure of individuals working in the unit to chemicals and fumes within the confined area.

The heat sources are arranged in rows and bombard the exposed surface of the PCB with infrared energy. Normally, commercial infrared bulbs provide uneven intensity of infrared bombardment over the area in which they project the infrared energy. The center of this area receives more energy than the peripheral edges. Thus, hot spots can occur. The air flow maintained by the fan, baffle and deflector arrangement tends to minimize the creation of these hot spots.

Pre-heating at the initial heating station usually occurs for a predetermined time, as for example approximately 2 minutes during which time the temperature of the solder on the PCB is elevated to approximately 350° to 440° F. When preheating to the desired temperature has been accomplished, the board is transferred to the final heating station 82 and positioned on the work surface 90 at this location. Heating in the same manner as described with reference to work station 80 occurs at station 82 which also generally requires several minutes. Heating at the second station continues until the temperature of the solder is elevated to about 450° F. which is above the eutectic temperature which is normally at about 370° although the melting temperature of solder varies somewhat with the type of solder. Therefore in order to ensure that de-soldering has occurred, generally the temperature at the final heating station will reach approximately 450°.

Once the PCB is heated to the required temperature range and the solder heated to its melting point by conduction of heat to the joints, the IC's are removed at the second station by an extraction tool. The extraction tool may be a simple mechanical device such as a pliers or a pair of tongs. The worker positioned in area 36 between stations 80 and 82 can efficiently transfer the PCB's to the first heating station and remove the components. The extracted components are normally deposited on a cooling tray in a manner so that they are not congested and will not touch one another so that re-attachment occurs as they cool. The cooling trays can be positioned on the sorting table 40 and once cooling has occurred, one of the workers, preferably the worker who also attends to the initial incoming processing will sort the components into compatible functions. For example, it would be typical to sort the IC's into related families such as TTL's, Memory, support chips, micro-P's, etc. Some mechanical repairs may be necessary such as pin straightening. The leads of the devices must be tinned. Cleaning may also be necessary and can be accomplished by soaking the devices for an appropriate length of time, for example 2 to 5 minutes in methyl alcohol and transferring the components to a water rinse, followed by drying.

The exhaust system serves to protect the workers from fumes which may be emitted in the processing and de-soldering operation. The fan also induces an air flow which discharges excess heat from the interior of the vehicle to the interior of the unit to minimize operator discomfort.

Thus, it will be seen that the present invention provides a novel salvage system providing a multiple station heating process. The system may be mobile increasing its efficiency and providing economy of operation.

While the principles of the invention have been made clear in the illustrative embodiments set forth above, it will be obvious to those skilled in the art to make various modifications to the structure, arrangement, proportion, elements, materials and components used in the practice of the invention. To the extent that these various modifications do not depart from the spirit and scope of the appended claims, they are intended to be encompassed therein.

What is claimed is:

1. A mobile apparatus for de-soldering electronic components from a substrate to which they are soldered comprising:
   (a) a mobile unit including:
      (i) an intake area for receiving components to be processed;
      (ii) a first heating station having first infrared heating means and a work-supporting surface;
      (iii) a second heating station having second infrared heating means and a work-supporting surface;
      (iv) said first and second heating stations being positioned adjacent one another with a work area therebetween so that both the heating stations are operable by a single worker in the work area whereby a substrate is subjected to infrared energy at said first heating station to pre-heat said substrate to a first predetermined temperature and thereafter transferred to said second heating station to effect further heating to de-solder said components for removal; and
      (v) a second work area for classifying the removed components.

2. The mobile apparatus of claim 1 wherein said mobile unit includes a preliminary sorting area.

3. The mobile apparatus of claim 1 wherein said mobile unit is a trailer.

4. The mobile apparatus of claim 1 wherein said mobile unit is a van.

5. The mobile apparatus of claim 1 wherein said mobile unit is self-propelled.

6. The mobile apparatus of claim 1 wherein said mobile unit includes an on-board power source.

7. The mobile apparatus of claim 6 wherein said on-board power source is a gas-powered electrical generator.

8. A salvage method for de-soldering electronic components from a substrate to which they are soldered, said method comprising practicing the following steps in a mobile unit at a salvage area:
   (a) preliminary sorting the substrates to be processed;
   (b) exposing at least a substantial portion of the surface of the substrate to bombardment by infrared energy at a first heating unit to heat the substrate to a first temperature of approximately 350° to 450° F. to cause heating of the solder securing the components;
   (c) transferring the substrate to a second heating unit which is spaced from the first heating by a work area;
   (d) exposing at least a substantial portion of the surface of the substrate to bombardment by infrared energy in the second heating unit to heat the substrate to a second temperature sufficient to effect substantial melting of the solder securing the components; and
   (e) thereafter removing selected of components from the substrate.

9. The method of claim 8 wherein said method is practiced in a mobile unit.

10. The method of claim 8 including an additional step of sorting the removed components into groups of similar components.

11. The method of claim 8 wherein the components include IC's having pins and including an additional step of performing mechanical repair to straighten the pins of extracted IC's.

12. The method of claim 8 including an initial step of pre-treating the substrate by washing the substrate in a solvent.

13. The method of claim 8 wherein said heating is controlled to maintain substantially even temperature and avoidance of hot spots.

14. The method of claim 13 wherein said temperature control is achieved by including a flow of air transversely across the first and second heating units.

15. The method of claim 8 wherein said substrate is a printed circuit board.

* * * * *